United States Patent [19]

Nestlerode

[11] Patent Number: 4,701,732
[45] Date of Patent: Oct. 20, 1987

[54] FAST TUNING RF NETWORK INDUCTOR

[75] Inventor: C. Dale Nestlerode, Fullerton, Calif.

[73] Assignee: Hughes Aircraft Company, Los Angeles, Calif.

[21] Appl. No.: 943,276

[22] Filed: Dec. 16, 1986

[51] Int. Cl.⁴ .............................................. H03J 5/24
[52] U.S. Cl. ....................................... 334/56; 333/32; 307/311; 307/259
[58] Field of Search ...................... 333/17 M, 32, 174; 334/56–58; 455/120–125

[56] References Cited

U.S. PATENT DOCUMENTS 3,906,405  9/1975  Kommrusch ..................... 333/32 X
4,477,817 10/1984  Anderson ...................... 333/17 M X
4,486,722 12/1984  Landt ............................... 333/32 X
4,564,843  1/1986  Cooper ................................. 343/745

*Primary Examiner*—Paul Gensler
*Attorney, Agent, or Firm*—T. A. Runk; A. W. Karambelas

[57] ABSTRACT

A variable inductor usable in a fast tuning RF network comprises a plurality of inductor switching circuits connected in series. Each inductor switching circuit includes an input terminal connected to a discrete inductor and to a PIN diode, and includes an output terminal connected to switches which are in turn connected to the parallel connected discrete inductor and PIN diode. The PIN diode operates in either the forward bias mode for switching out the respective discrete inductor, or in the reverse bias mode for switching in the respective discrete inductor. The PIN diode is forward or reverse biased by MOSFET switches one of which has a parasitic capacitor used to provide a charged rectified reverse bias voltage to the PIN diode to insure reverse bias operation during large voltage changes in the conducted RF signals. The MOSFET switches are controlled by logic signals so that rapid switching by computer or other processor control is possible. Electrical isolation of the logic control circuitry is provided by optically coupling the control signals to the MOSFET switches.

21 Claims, 4 Drawing Figures

FAST TUNING RF NETWORK INDUCTOR

BACKGROUND

1. Field of Invention

The present invention relates to RF (radio frequency) networks and more specifically to RF networks having variably controlled inductors for selective tuning.

2. Background Description

In many RF network applications, transmission source signals are used to electrically excite an antenna for propagating electromagnetic radiation. As with RF reception circuitry receiving the radiated transmitted signals, the transmission RF network is typically tuned to a particular transmission frequency within a frequency bandwidth. However, the RF transmitter may have an RF signal source operated at many different frequencies during use. Thus, some RF networks may require variable components. For example, an antenna matching RF network may have variable inductors which are electronically controlled by peripheral electronic circuitry. In such instance, the transmission antenna is coupled to the RF signal source through a tuned RF network having a selectable resonant impedance matching frequency. As the operative source frequency is changed, the tuned circuit resonant frequency should change correspondingly so as to obtain maximum energy transfer and optimum impedance match between the signal source and the transmission antenna. Conventionally, the tuned RF matching network will maintain a fifty ohm impedance match between the signal source and the antenna over the selected frequency range for efficient energy transfer to the antenna.

In order to permit rapid electronic selection and changing of the transmission or reception frequency, the values of tuned components such as inductors or capacitors must be changeable with an appropriate fast speed. These value changes are typically controlled by external electronic control lines. Thus, the tuned components should have variable values which are switched at high speed and selectable by external electrical control signals.

A typical implementation of a variably tuned network includes a plurality of discrete fixed inductance value inductors connected in series. Each of the inductors has a respective parallel short circuit switch which is opened or closed so as to respectively switch "in" or "out" the fixed discrete inductor within the series connection. The values of those inductors which are switched in, that is, when their respective short circuit switch is open circuit, are summed to a total inductance value. The maximum inductance value results when all the inductors are switched in, that is, with an open circuit switch position for each of their respective switches. The minimum inductance value which is optimally negligible results when none of the inductors are switched in, that is, when their respective switches are in a closed circuit switch position thereby shorting the inductors.

The switches must have a suitable switching speed to enable rapid selection of different operating frequencies especially for computer controlled frequency "hopping" applications. Certain types of mechanical switches, e.g. reed switches and vacuum switches, are able to switch at relatively high speeds, however most of these switches have a significant amount of parasitic capacitance associated with their "off" state. Such parasitic capacitance can de-tune a network of series connected inductors as discussed above. Thus, a solid state switch may be used in series with the mechanical switch to block this parasitic capacitance from reacting with the respective inductor.

Further problems with present mechanical switches include their inability to withstand relatively high RF power levels and still have a reasonably fast switching time. A further problem arises in the "settling time" of the switch. In a transmitting operation, the transmitter is typically turned off when switching to avoid arcing and the generation of spurious signals. When summing the time required to turn the transmitter off and then on, that is, the switching and settling times of the mechanical switch, the result is a relatively slow switching means when compared to solid state switches. However, in certain applications, a mechanical switch may be more desirable.

Solid state switches have been used to switch respective inductors in or out of the circuit. The solid state switches used to selectively switch in or out the inductors preferably have a low conducting short circuit "on" resistance and a low open circuit "off" capacitance so as not to affect the resonant frequency of the tuned RF network. Positive Intrinsic Negative (PIN) junction diodes meet these switch requirements. PIN diodes have been used for inductor switching in variably tuned inductor matching networks. It has been found that the PIN diode is well suited for UHF and VHF transmission in circuits of series connected inductors with respective parallel connected PIN diodes because of the long lifetime of the PIN diode. During use with high voltage RF signals conducting through the inductors, the PIN diode exhibits a long on-lifetime based on minority carriers within the device, and remains in conduction thereby shorting out the inductor even during large fluctuation of the voltage of the RF signal.

The high voltage RF signals cause conventional PN junction diodes to turn on and off as the RF signal varies. Hence, these PN diodes are not well suited for switching in high voltage RF signal applications. However, the PIN diodes with an on-lifetime of up to six microseconds, are well suited for high voltage UHF and VHF applications. This long on-lifetime is in contradistinction to the on-lifetime of the PN diode which tends to stop conduction during the negative phase of the high voltage RF signal whereas, the PIN diode with its long on-lifetime, will remain in conduction during the entire signal phase and continue to short out the parallel connected inductor in high frequency applications. For further understanding of various applications using the PIN diode in variable tuning RF networks see U.S. Pat. Nos. 4,564,843, to Cooper; 4,477,817 to Anderson; and 4,486,722 to Landt.

However, the PIN diode is not well suited for low frequency HF applications (three to thirty megahertz), because its on-lifetime is not long enough to keep it turned on during the negative phase of high voltage HF signals. The period of the negative phase of the high voltage HF signal may exceed the minority carrier life-time causing the PIN diode to stop conduction and thereby fail to short circuit the inductor.

Additionally, prior techniques using the PIN diodes, as with other diodes, disadvantageously used a separate DC current source for each separate PIN diode during a forward bias short circuit operation and disadvantageously used a separate reverse bias voltage source for each separate PIN diode during open circuit operation. Certain heretofore applications of the PIN diode have therefore required special reverse voltage drivers and forward current drivers to insure that the PIN diode does not forward conduct in the presence of fluctuating high voltage RF signals when the PIN diode was in the reverse bias off state, or, to insure that the PIN diode does not turn off in the presence of the fluctuating high voltage RF signal when the PIN diode was in the forward bias on state. These separate forward current and reverse bias voltage requirements disadvantageously required many special, large, complicated and costly driver circuits because one was required for each diode. Such biasing source requirements limited the usefulness of PIN diodes in small-sized radios.

A disadvantage of using electrical control lines with the PIN diode is the lack of inherent isolation between the various components in the tuning RF network which conducts the high voltage RF signals and the control circuits such as the forward current and reverse voltage driver circuits of the PIN diodes which may be, for example, controlled by five volt digital computer systems. Such lack of isolation has been found to interfere with the RF signals. These and other disadvantages are solved or reduced by the fast tuning RF network inductor of the present invention.

SUMMARY OF THE INVENTION

An object of the present invention is to provide a controllable, variable inductor usable in an RF network which employs conventional and commercially available parts and has a wide frequency operating bandwidth including low frequency HF operation.

Another object of the present invention is to provide a diode switching arrangement for use in an RF network in which a current path conducts forward bias current through either each of the switching diodes when they are switched on and conducting, or through each of the respective parallel connected discrete inductors when their respective switching diodes are switched off and not conducting.

A further object of the present invention is to provide a diode switching arrangement for use in controlling and varying the inductance value of an RF network in which a single current source provides forward DC bias current through the switching diodes when they are switched on and conducting, or through respectively connected parallel inductors when their respective switching diodes are switched off and not conducting, and which arrangement does not require separate forward current and reverse voltage driver circuits for each diode.

Still another object of the present invention is to provide a diode switching arrangement for use in an RF network in which a reversed bias voltage is established and applied to a switching diode when the switching diode is switched off so that when a high voltage RF signal conducts through the respective parallel connected inductor, the reverse bias voltage insures that the switching diode remains off even during large fluctuations of the high voltage RF signal.

Yet another object of the present invention is to provide a diode switching arrangement for use in an RF network in which electrically isolated logic circuits are used and these logic circuits are protected from the high voltage RF signals conducting through the RF network, and which arrangement may also be applied to control and vary the inductance value of the RF network.

The preferred embodiment of the present invention includes a plurality of similar inductor switching circuits connected in series, each of which includes a PIN diode which is selectively controlled by conventional digital type signals. Each circuit has an input terminal and an output terminal between which is connected in parallel a fixed value inductor connected in series to a first switch, and a PIN diode connected in series with a second switch. These two series connections form alternate parallel current paths between the input and output terminals. The current through each path is controlled by the respective switch alternately operated in either an open or a closed circuit condition.

A capacitor is provided in parallel with the second switch and is connected between the PIN diode and the output terminal. When the diode is switched "off" by the second switch being in an open condition, this capacitor stores the reverse bias voltage required to keep the PIN diode in that off state during large RF signal fluctuations. When the diode is switched "on" by the second switch being in a closed condition, this capacitor is then discharged and short circuited by the second switch so as not to de-tune the RF network.

A single DC current source is connected at the input of the first inductor switching circuit and provides a forward bias current conducting through the inductor switching circuits to a return connection at the output of the last inductor switching circuit.

In each inductor switching circuit, the forward bias current conducts either through the inductor or the PIN diode as selected by the two alternately operated switches. In a preferred embodiment, these switches are solid state metal oxide silicon field effect transistor (MOSFET) switches.

Light emitting diodes (LEDs) are used to activate photovoltaic diodes which drive the MOSFET switches. The light conducting dielectric medium between the LEDs and the photovoltaic diodes provides isolation between the external logic circuits and the MOSFET switches, and any high voltage signals existing in the RF network.

Parasitic capacitance of the MOSFET switch in series with the PIN diode establishes and stores a rectified reverse bias voltage which is applied to the PIN diode during the time the PIN diode is in the off reverse bias condition so as to insure that the PIN diode remains reverse biased during all phases of any high voltage RF signal including HF signals. This arrangement eliminates the need for separate reverse bias voltage sources for each diode and corresponding separate driver circuits.

The use of MOSFET switches in the above-described arrangement is characterized by low resistance when the PIN diode and associated MOSFET switch are on, low off capacitance when PIN diode and associated MOSFET switch are off, electrical isolation between any RF signal in the circuit and the logic control signals, stable on and off states of both the PIN diodes and switches during high voltage fluctuation, high speed switching and relatively easy manufacture using conventional components. These and other advantages will become more apparent in the following detailed description of the preferred embodiments and the accompanying drawings.

DETAILED DESCRIPTION OF THE PREFERRED EMBODIMENTS

Figure 1:
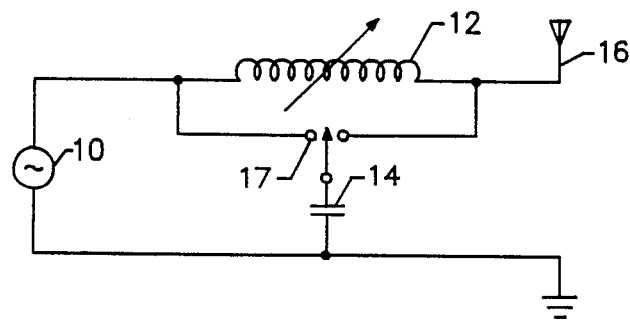
FIG. 1 is a prior art schematic diagram of an "L" impedance matching circuit having a variable inductor.
Figure 2:
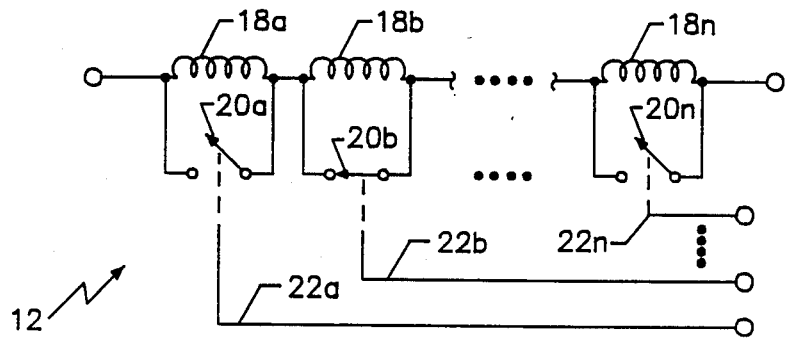
FIG. 2 is a prior art schematic diagram of the variable inductor of FIG. 1 comprising serially connected discrete inductors.

FIGS. 1 and 2 are high level representations of prior techniques. Referring to FIG. 1, a signal source 10 is connected to an "L" impedance matching circuit comprising a variable inductor 12 and a capacitor 14. The variable inductor 12, as shown and hereinbelow discussed is used for both transmission and reception applications. The signal source 10 has a conventional fifty ohm output impedance. The "L" network has a resonant frequency network response such that a typical fifty ohms resistive impedance load upon the signal source 10 is achieved for maximum efficiency and energy transfer. The "L" network is connected to an antenna 16, which, in the case of transmission, is used to propagate electromagnetic radiation. Though represented as using a switch 17 in FIG. 1, the capacitor 14 is actually typically hardwired to the inductor 12 at one of its two terminals. The capacitor 14 is connected to either the source terminal or the antenna terminal of the inductor 12 for impedance step-up or step-down matching.

The circuit of FIG. 1 is usable for both transmission and reception. The reception network circuits can equally take advantage of variable inductor impedance matching "L" networks to receive the maximum signal possible. In certain applications, the antenna 16 may be an RF whip antenna which can be driven by a high power signal source 10, e.g. 150 Watt signal source, or can be used to receive a small signal such as on the order of microvolts. Thus, in both applications of transmission and reception, a variably tuned "L" network can provide for high efficiency.

FIG. 2 is high level representation of the variable inductor 12 shown in FIG. 1. Referring to FIGS. 1 and 2, the variable inductor 12 comprises a plurality of individual discrete inductors 18a through 18n connected in series. Each of the inductors 18a through 18n has a respective switch 20a through 20n connected in parallel for selectively switching in or out each of the inductors 18. A plurality of control lines 22a through 22n are respectively connected to each of the switches 20a through 20n and control the switches 20 to an open or closed position. By way of example, the value of each inductor may be eight microhenries with a total inductance of ninety-six microhenries using twelve discrete inductors. In the present example, the number of open switches multiplied by eight microhenries is the value of the total inductance.

However, in a different case, each inductor could have a different inductance value. By selecting particular inductors, the total inductance value may be non-linearly altered. Where the discrete inductors are selected electrically the set of selected inductance values may be assigned to different electrical codes thereby establishing a coding scheme where certain codes result in certain inductance values within a desired range. Different particular coding schemes can be implemented. For example, a binary coding scheme in which each inductor 18 has twice the inductance of its preceding inductor 18, could be used to select a desired range and resolution using suitable digital computer controls. It should be apparent that different coding schemes may be implemented.

Figure 3:
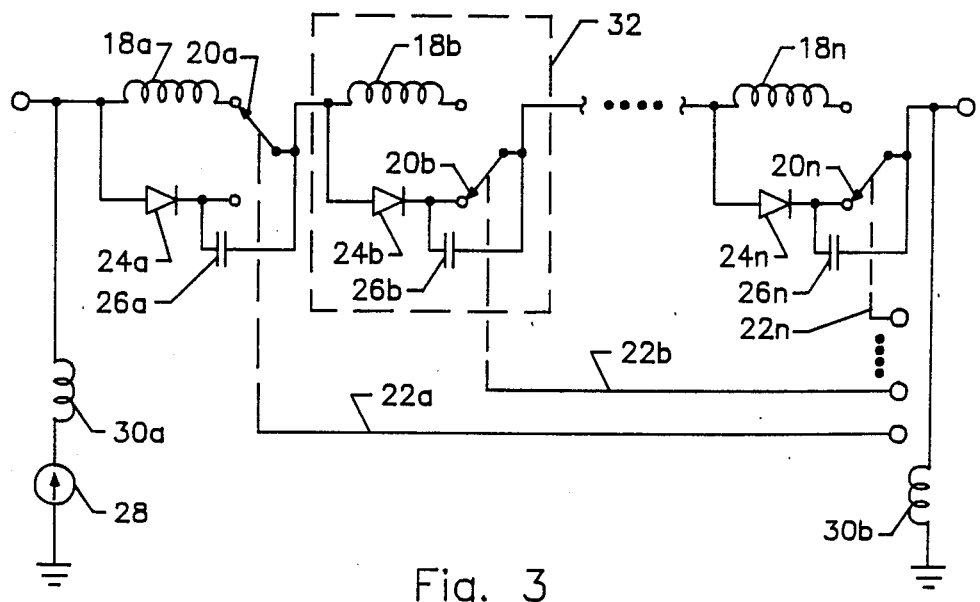
FIG. 3 is a schematic diagram of a variable inductor comprising serially connected parallel PIN diodes and discrete inductor switching circuits of the present invention.
Figure 4:
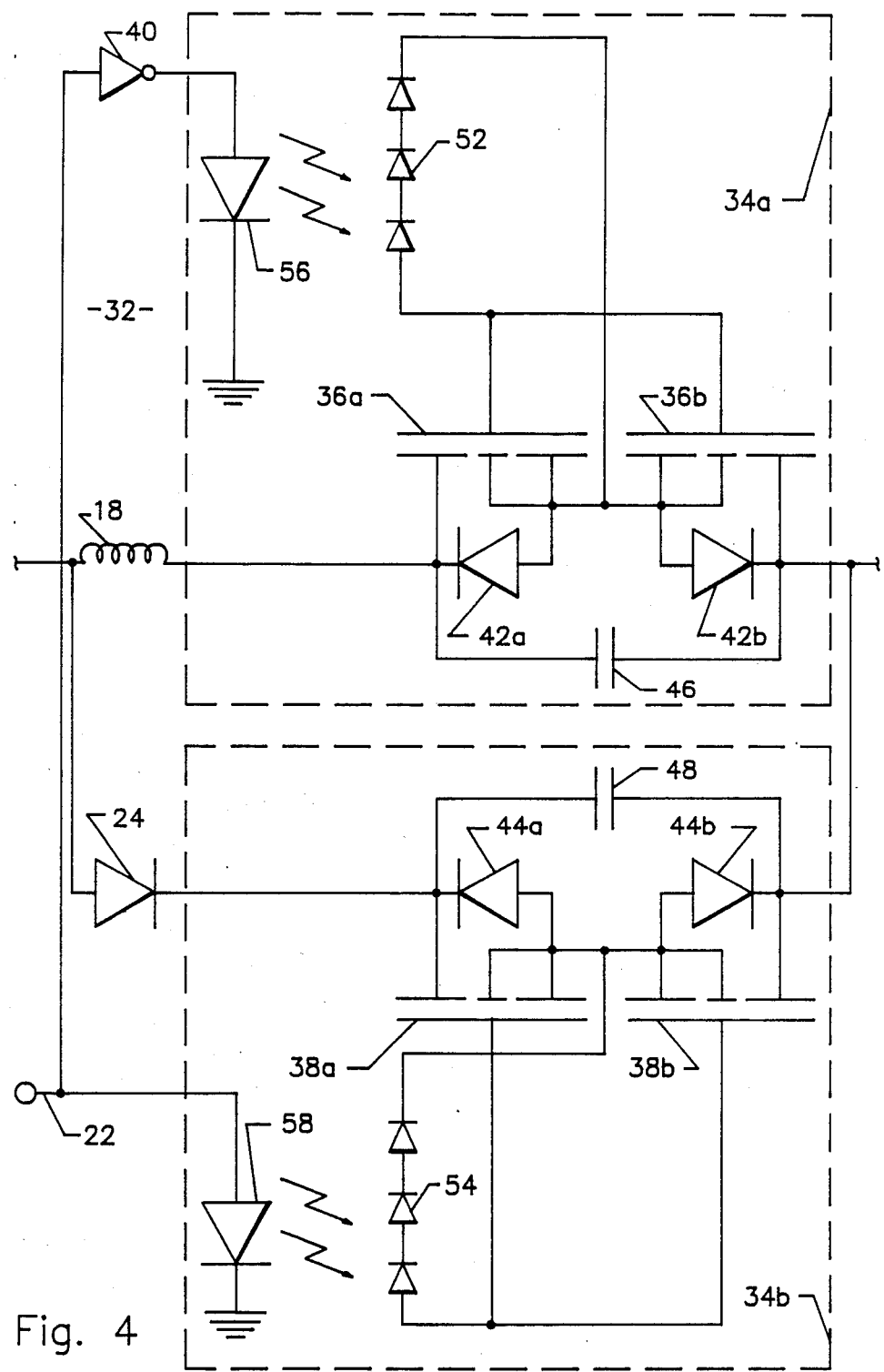
FIG. 4 is a detailed schematic diagram of a parallel PIN diode and discrete inductor switching circuit of the present invention.

Embodiments of the present invention are shown in detail in FIGS. 3 and 4. Referring to FIG. 3, a variable inductor comprises a plurality of series connected discrete inductors 18a through 18n each having a respective switch 20a through 20n respectively controlled by control lines 22a through 22n. As schematically shown, and by way of example, the inductor 18a is switched in, while inductors 18b and 18n are switched out, and the respective PIN diode 24a is off and switched out, while respective PIN diodes 24b through 24n are on and switched in.

The switching means 20a–20n is shown as a single pole double throw switch which may be controlled to switch between the inductor 18 circuit and the diode 24 circuit. This switching means may comprise a mechanical switch such as that described in the background section above. In this embodiment, and by way of example, a series diode 24a is used with the switch 20a to block the parasitic capacitance of the switch from detuning the inductor 18 when the switch has been controlled to be open circuited in the diode circuit.

Each inductor 18a through 18n is switched out as each respective PIN diode 24a through 24n is on and switched in, and vice-versa, using each respective switch 20a through 20n. A forward bias DC current in addition to any provided signal conducts either through an inductor 18 or a respective PIN diode 24 depending upon which is switched in. Though other diodes may be used, the PIN diode is preferred as discussed previously because of its relatively low on resistance, relatively low off capacitance and relatively high current conduction capacity.

Significantly, capacitors 26a through 26n, respectively connected to the PIN diodes 24a through 24n, are charged up to a positive rectified voltage level during the first half cycle of an RF high voltage signal after a respective inductor 18a through 18n is switched in. This stored positive rectified voltage level on a capacitor 26 prevents conduction of current through a respective PIN diode 24 to insure that the PIN diode 24 remains off when its respective inductor 18 is switched in. The capacitor 26 keeps the diode "off" during high voltage RF signal fluctuations. Without the capacitor 26, parasitic capacitance of the PIN diode 24 may enable some conduction through it and de-tuning the RF network in the presence of high voltage RF signals when the PIN diode should be off and switched out.

In operation, and by way of example, when the inductor 18a is switched in as shown, and as the voltage increases at the anode terminal of the PIN diode 24a, forward current conducts through the PIN diode 24a to positively charge up the capacitor 26a at the cathode terminal of the PIN diode 24a. Then, during the first negative half cycle of a high voltage RF signal and all remaining cycles of the RF signal on the anode of the PIN diode 24a, a rectified positively charged voltage remains stored by the capacitor 26a. This stored voltage is blocked from decay through the cathode terminal of the PIN diode 24a and serves to reverse bias that PIN diode 24a, until the inductor 18a is subsequently switched out. Hence, the capacitors 26 are conveniently used to establish a rectified reverse bias voltage upon the PIN diodes 24 without the need for separate special reverse bias driver circuits.

Forward bias current is provided by a current source 28. The forward bias current conducts either through the PIN diode e.g. 24b and 24n, to short circuit the respective inductor, e.g. 18b and 18n, or conducts though the inductor e.g. 18a, which is switched in. The current source 28 may be, for example, constructed using a commercially available National Semiconductor Corporation LM109 100 mA current regulator circuit. This single current source 28 eliminates the need for a separate individual forward bias current driver circuit for each respective PIN diode 24. Wideband RF choke inductors 30a and 30b are use to isolate the RF signal from the DC current source 28 as is standard practice in the art.

This variable inductance circuit configuration of FIG. 3 has broadband frequency applications including HF network tuning applications because the PIN diodes 24 will not conduct and turn on in the presence of a high voltage HF signals with a reverse bias voltage stored on capacitors 26. Additionally, the PIN diode will remain forward biased in the presence of the negative phase of a high voltage HF signal having a period exceeding the life-time of its minority carriers because the DC forward bias current routed through them will keep them switched on. Furthermore, switches 20 are preferably fast switching devices enabling rapid selection of different inductance values and correspondingly enabling rapid selection of the tuned frequencies of the RF network. As shown in FIG. 3, the variable inductor comprises a plurality of similar inductor switching circuits 32 for variable inductor tuning enabling rapid frequency hopping. An inductor switching circuit 32 in accordance with the present invention is shown in further detail by way of schematic representation in FIG. 4.

Referring to FIG. 4, a second embodiment of the present invention is shown in which the switching means comprises solid state devices. A single inductor switching circuit 32 is shown and comprises the discrete inductor 18 having a first terminal connected to the anode of the PIN diode 24. A second terminal of the inductor 18 and the cathode terminal of the PIN diode 24 are respectively connected to solid state switches 34a and 34b. The switches 34a and 34b may be assembled using conventional discrete components, and may also be M86F2 Military Power FET AC/DC Switching Hybrid Solid State Switches manufactured by Teledyne Corporation.

The input of the gates of the switches 34 are optically isolated to protect delicate input logic circuits from output voltage transients and high voltage RF signals. The inputs of the switches 34 which are connected to the control line 22, are preferably buffered to enable the hybrid switches 34 to be driven directly by CMOS (complementary metal oxide silicon) logic gates or standard TTL (transistor transistor logic) interface circuitry. Preferably, Schmitt triggers at the input of each of the switches 34 would increase noise margins when using the switches 34 with the CMOS type input signals to prevent false triggering of the switches 34 in noisy environments. A central component of the solid state hybrid switches 34 are power switching MOSFETs 36a, 36b, 38a and 38b which typically exhibit minimized on-state resistance and offset voltages.

In this preferred embodiment, a logic control signal on line 22 drives the logic input of switch 34b and drives a logic inverter 40 which in turn drives the logic input of the second switch 34a. This arrangement is an example of one embodiment. Other circuit connections and logic components may be used to achieve the same result. The logic control signal line 22 and inverter 40 are used to turn on one switch, e.g. 34a, or the other, e.g. 34b, alternately. The DC forward bias current, from the current source 28 of FIG. 3, will then conduct through either the inductor 18 when switch 34a is on and switch 34b is off, or through the PIN diode 24 when switch 34b is on and switch 34a is off, but not through both at the same time.

An advantage of an RF tuning network in accordance with the present invention is that the inductor switching circuit 32 has no moving parts and is directly controlled by logic switching circuits compatible with computer control and may be operated at high speed. The preferred implementation of the variable inductor is with a binary incremental inductance coding scheme providing a suitable range and resolution with inductance values selected by direct computer control. Moreover, the hybrid switches 34 are used to short the inductor 18, and as referenced above, are used because of their inherent low on resistance, low off parasitic capacitance, capacity to conduct high DC forward bias current, good electrical isolation, compatibility with high speed logic control and capacity to conduct high voltage RF signals.

In the preferred embodiment, the power switching MOSFETs 36 and 38 have parasitic PN diodes 42 and 44, respectively, and parasitic capacitors 46 and 48, respectively, as shown in FIG. 4. The high capacitance value of the parasitic capacitors 46 and 48 would normally be taken into account for correct frequency tuning. However, when switch 34a is on, MOSFETs 36 are conducting thereby making the parasitic capacitor 46 relatively insignificant. In the case of PIN diode 24 and switch 34b, the off capacitance of the PIN diode 24 is inherently small and dominates over and blocks the capacitance of the parasitic capacitor 48 when switch 34b is off, thereby providing the low off capacitance. Alternatively, when switch 34b is on, the parasitic capacitor 48 is short circuited and is likewise made relatively insignificant. When on, switch 34b and the PIN diode 24 presents a relative short circuit across the inductor 18 and the parasitic capacitor 46. Hence, the parasitic capacitors 46 and 48 do not de-tune or substantially affect the frequency response of the variable RF tuned network in accordance with the present invention.

To keep the switches 34 conducting during bidirectional high RF current and voltage signals, back-to-back connections of two switching MOSFETs 36a and 36b, and 38a and 38b and back-to-back connections of the parasitic PN diodes 42a and 42b and 44a and 44b, are required. A single MOSFET connection may not otherwise conduct positive and negative voltage phases of the RF signal because of the inherent unidirectional operation of a MOSFET. These back-to-back connections enable conduction of both positive and negative voltages of the RF signal through the switches 34.

Of operational importance is the parasitic capacitor 48, which is used to rectify a positive voltage on the cathode terminal of the PIN diode 24 so as to cause reverse biasing and to insure that the PIN diode 24 will not conduct in the presence of a high voltage alternating RF signal.

In the preferred embodiment of the present invention, the switching power MOSFETs 36 and 38 are enhancement type devices and controlled by the presence or absence of a positive voltage on their gate electrodes. The gate voltage is generated by light impinging on a series array of photovoltaic elements (for example, small area silicon solar cells,) 52 and 54. The light is provided by light emitting diodes (LED) 56 and 58. The LEDs 56 and 58 can be driven at high speed under five volt logic control signals to provide tne fast RF network tuning needed in frequency hopping communications equipment. The light beam coupling of the control signals provides minimal stray capacitive loading on the RF inductor network and provides dielectric isolation to the computer control circuits from high voltage RF signals that may occur in the fast tuning RF inductor network. The plurality of photovoltaic elements 52 and 54 may each comprise for example, twenty two identical elements providing sufficiently fast current and voltage changes to rapidly charge and discharge the gate electrode terminals of the power MOSFETs 36 and 38.

The inductor switching circuit 32 provides for fast solid state switching of the inductor 18 with electrical isolation between control circuitry (not shown) driving line 22 and the high voltage RF signals. The circuit 32 comprises relatively few parts and is cost efficient.

Modifications of the present invention may be made by those skilled in the art, however, such modifications may nevertheless represent applications and principles within the scope of the present invention as defined by the following claims.

What is claimed is:

1. An inductor switching circuit having an input terminal and an output terminal, comprising:
   an inductor having first and second terminals and having its first terminal coupled to the input terminal;
   a diode having first and second terminals and having its first terminal coupled to the input terminal;
   switching means for coupling the output terminal alternately to the second terminal of the inductor and the second terminal of the diode;
   control means for selectively controlling the switching means to switch between the second terminal of the inductor and the second terminal of the diode;
   a capacitor coupled between the second terminal of the diode and the output terminal; and
   biasing means for providing bias energy through the input terminal and the output terminal.

2. The inductor switching circuit of claim 1 wherein the diode comprises a PIN diode.

3. The inductor switching circuit of claim 2 wherein the biasing means comprises a constant current source providing a constant current through the input and output terminals.

4. The inductor switching circuit of claim 1 wherein the control means comprises optical coupling means for providing light signals to control the switching means.

5. The inductor switching circuit of claim 1 wherein the switching means comprises:
   a first switching means for coupling the second terminal of the inductor to the output terminal;
   a second switching means for coupling the second terminal of the diode to the output terminal; and
   the control means is for controlling the first and second switching means to couple the output terminal alternately to the second terminal of the inductor and the second terminal of the diode respectively.

6. The inductor switching circuit of claim 5 wherein the first and second switching means comprise first and second solid state switches respectively which couple the output terminal to the second terminal of the inductor and to the second terminal of the diode respectively as controlled by the control means.

7. The inductor switching circuit of claim 6 wherein:
   the second solid state switch comprises parasitic capacitance which is disposed between the second terminal of the diode and the output terminal; and
   whereby the capacitor comprises the parasitic capacitance of the second solid state switch.

8. The inductor switching circuit of claim 4 wherein:
   the switch means comprises first and second switching means which respectively comprise first and second solid state switches which couple the output terminal to the second terminal of the inductor and to the second terminal of the diode respectively as controlled by the control means;
   the control means is for controlling the first and second switching means to couple the output terminal alternately to the second terminal of the inductor and the second terminal of the diode respectively;
   the second solid state switch comprises parasitic capacitance which is disposed between the second terminal of the diode and the output terminal;
   whereby the capacitor comprises the parasitic capacitance of the second solid state switch; and
   the optical coupling means comprises first and second light generating means for providing light control signals to the first and second switching means respectively and comprises first and second light receiving means for providing electrical control signals to control the solid state switches to switch in response to the light signals of the first and second light generating means respectively.

9. The inductor switching circuit of claim 8 wherein:
   the first and second solid state switches each comprise a MOSFET device having a gate;
   the diode comprises a PIN diode;
   the biasing means comprises a constant current source providing a constant current through the input and output terminals;
   the control means further comprises a processor means for providing first and second electrical control signals;
   the first and second light generating means each comprise a light emitting diode responsive to the respective electrical control signals to provide the light control signals; and
   the first and second light receiving means each comprise a photosensitive device coupled to the gate of the respective MOSFET device and responsive to the respective light control signals to control the MOSFET device to switch.

10. An inductor switching circuit having a main input terminal and a main output terminal, and having a plurality of inductors coupled in a series relationship, comprising:
    each inductor having first and second terminals;

a plurality of input terminals, one each of which is coupled to the first terminal of an associated inductor, and one of which is coupled to the main input terminal;

a plurality of diodes, one each of which is associated with a respective inductor, each diode having first and second terminals, the first terminal of each of the diodes being coupled to the respective input terminal to which the associated inductor is coupled;

a plurality of output terminals one each of which is associated with a respective inductor and associated diode;

switching means for coupling a respective output terminal alternately to the second terminal of the inductor and the second terminal of the respective diode;

control means for selectively controlling the switching means to switch between the second terminal of the inductor and the second terminal of the diode;

a plurality of capacitors, one each of which is coupled between the second terminal of a respective diode and the respective output terminal;

the plurality of inductors and respective switching means being coupled in series such that the respective output terminal associated with one inductor is coupled to the respective input terminal associated with another inductor, the input terminal associated with one inductor being coupled to the main input terminal and the output terminal associated with a different inductor being coupled to the main output terminal; and biasing means for providing bias energy through the main input terminal and the main output terminal.

11. An inductor switching circuit having an input terminal and an output terminal, comprising:

an inductor having first and second terminals and having its first terminal coupled to the input terminal;

a diode having first and second terminals and having its first terminal coupled to the input terminal;

first switching means for coupling the second terminal of the inductor to the output terminal;

second switching means for coupling the second terminal of the diode to the output terminal;

control means for controlling the first and second switching means to couple the output terminal alternately to the second terminal of the inductor and the second terminal of the diode respectively;

a capacitor coupled between the second terminal of the diode and the output terminal; and biasing means for providing bias energy through the input terminal and the output terminal.

12. The inductor switching circuit of claim 11 wherein the diode comprises a PIN diode.

13. The inductor switching circuit of claim 12 wherein the biasing means comprises a constant current source providing a constant current through the input and output terminals.

14. The inductor switching circuit of claim 12 wherein the control means comprises optical coupling means for providing light signals to control the switching means.

15. The inductor switching circuit of claim 12 wherein the first and second switching means comprise first and second solid state switches respectively which couple the output terminal to the second terminal of the inductor and to the second terminal of the diode respectively as controlled by the control means.

16. The inductor switching circuit of claim 15 wherein:

the second solid state switch comprises parasitic capacitance which is disposed between the second terminal of the diode and the output terminal; and whereby the capacitor comprises the parasitic capacitance of the second solid state switch.

17. The inductor switching circuit of claim 14 wherein:

the first and second switching means respectively comprise first and second solid state switches which couple the output terminal to the second terminal of the inductor and to the second terminal of the diode respectively as controlled by the control means;

the second solid state switch comprises parasitic capacitance which is disposed between the second terminal of the diode and the output terminal;

whereby the capacitor comprises the parasitic capacitance of the second solid state switch; and the optical coupling means comprises first and second light generating means for providing light control signals to the first and second switching means respectively and comprises first and second light receiving means for providing electrical control signals to control the solid state switches to switch in response to the light signals of the first and second light generating means respectively.

18. The inductor switching circuit of claim 17 wherein:

the first and second solid state switches each comprise a MOSFET device having a gate;

the control means further comprises a processor means for providing first and second electrical control signals;

the first and second light generating means each comprise a light emitting diode responsive to the respective electrical control signals to provide the light control signals; and the first and second light receiving means each comprise a photosensitive device coupled to the gate of the respective MOSFET device and responsive to the respective light control signals to control the MOSFET device to switch.

19. An inductor switching circuit having an input terminal and an output terminal, comprising:

an inductor having first and second terminals and having its first terminal coupled to the input terminal;

a PIN diode having first and second terminals and having its first terminal coupled to the input terminal;

first solid state switching means for coupling the second terminal of the inductor to the output terminal;

second solid state switching means for coupling the second terminal of the diode to the output terminal, the second solid state switching means comprising capacitance disposed between the second terminal of the diode and the output terminal;

processor means for providing first and second electrical control signals for controlling the first and second switching means to couple the output terminal alternately to the second termnal of the inductor and the second terminal of the diode respectively;

first light generating means for providing first light control signals in response to the first electrical control signals;

second light generating means for providing second light control signals in response to the second electrical control signals;

first light receiving means for controlling the switching of the first solid state switching means in response to the first light control signals;

second light receiving means for controlling the switching of the second solid state switching means in response to the second light control signals; and biasing means for providing a constant current through the input and output terminals.

20. The inductor switching circuit of claim 19 wherein:

the first and second light generating means each comprise a light emitting diode responsive to the respective electrical control signals to provide the light control signals; and the first and second light receiving means each comprise a photosensitive device responsive to the respective light control signals for controlling the switching of the second solid state switching means in response to the second light control signals.

21. The inductor switching circuit of claim 20 wherein:

the first and second solid state switches each comprise a MOSFET device having a gate; and the photosensitive device of each solid state switch is coupled to the gate of the respective MOSFET device to control the MOSFET device to switch.

* * * * *